(12) United States Patent
Cherukuri

(10) Patent No.: US 7,352,633 B2
(45) Date of Patent: Apr. 1, 2008

(54) MULTIBIT MEMORY CELL

(75) Inventor: John R. Cherukuri, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/241,587

(22) Filed: Sep. 30, 2005

(65) Prior Publication Data

US 2007/0076491 A1   Apr. 5, 2007

(51) Int. Cl.
*G11C 7/10* (2006.01)

(52) U.S. Cl. .................... 365/189.01; 365/230.03; 365/156

(58) Field of Classification Search ........... 365/189.01, 365/230.03, 156, 173, 230.05, 230.06
See application file for complete search history.

(56) References Cited

U.S. PATENT DOCUMENTS

| | | | | |
|---|---|---|---|---|
| 6,067,257 A * | 5/2000 | Kitsukawa et al. | .... | 365/189.11 |
| 6,141,289 A * | 10/2000 | Amer | ..... | 365/230.05 |
| 6,617,621 B1 * | 9/2003 | Gheewala et al. | ..... | 257/207 |
| 6,778,434 B2 * | 8/2004 | Tsuji | ..... | 365/173 |
| 6,880,144 B2 * | 4/2005 | Kumala | ..... | 716/9 |
| 6,934,175 B2 * | 8/2005 | Nishihara | ..... | 365/65 |
| 7,123,498 B2 * | 10/2006 | Miyatake et al. | ..... | 365/63 |
| 2006/0022600 A1 | 2/2006 | Kitazawa | | |

OTHER PUBLICATIONS

Hwang, J., "ROM/PROM/EPROM", *The VLSI Handbook*, Sep. 30, © 2000 CRC Press LLC.

* cited by examiner

*Primary Examiner*—Anh Phung
*Assistant Examiner*—Dang Nguyen
(74) *Attorney, Agent, or Firm*—Konrad Raynes & Victor

(57) ABSTRACT

Provided are a method, system and device for storing multiple bits into a multibit memory cell. In the illustrated embodiment, each multibit memory cell is a "quadbit" cell capable of storing 4 bits which are read out on four bit lines of the cell in response to activation of a common word line. In the illustrated embodiment, the bit subcells of each cell are arranged in a 2 by 2 array in which two pairs of subcells are each aligned in a longitudinal direction . Conversely, each of two pairs of subcells are also aligned in a transverse direction. Additional embodiments are described and claimed.

20 Claims, 7 Drawing Sheets

MULTIBIT MEMORY CELL

BACKGROUND

Data is often stored as "words" of data in which each word generally comprises a fixed number of bits. Each bit is typically stored in a memory cell. A word of data may be accessed from a memory by activating a particular word line and reading the bits of the accessed word on individual bit lines electrically coupled to cells of the memory. To facilitate accessing a word, the cells of a memory are typically arranged in orthogonal columns and rows.

FIG. 1 shows one example of a prior art array 10 of memory cells 12 arranged in a plurality of columns 14a, 14b . . . 14n and rows 16a, 16b . . . 16n. Each memory cell 12 stores one bit of data. In this example, a word has n bits which are read out on bit lines BL0, BL1 . . . BLn. Each Word WL0 WL1 . . . selects which word to read. Each bit line BL0, BL1 . . . BLn is electrically coupled to each of the cells 12 in a particular row 16a, 16b . . . 16n of the array 10. The bits stored in a particular column 14a, 14b . . . 14n of bit cells 12 may be read by activating a particular word line WL0, WL1 . . . WLn which is electrically coupled to each bit cell 12 of an associated column 14a, 14b . . . 14n of bit cells 12.

There are various types of memory for storing data including read only memory (ROM) and random access memory (RAM). In general, the data stored in a ROM is nonvolatile, that is, it is not lost when power is removed. In addition, data stored in a ROM is frequently unchangeable. However, in some ROM types, data is changeable by a special operation. For example, in flash ROM memory, data may be erased in a section referred to as a block by applying an electric field to each cell of the block. Absent this special operation, data is normally maintained even when power is removed. In contrast, data stored in a RAM is often volatile, that is, it is lost when power to the memory is removed. In addition, data stored in a RAM is frequently readily changeable without utilizing special operations to change the data.

The internal structure of a memory cell may vary depending upon the type of memory. For example, known ROM memory cells may contain a device such as a diode, a programmable fuse, or a field effect transistor (FET). FIG. 2 shows an example of a 4 by 4 array 20 of memory cells 12a and 12b in which each cell 12a is programmed with a logical 1 by placing an FET 22 in each cell 12a as shown. Each cell 12b is programmed with a logical 0 by omitting the placement of an FET in the cell 12b. By placing a signal on a word line such as word line WL0, for example, a signal (representing a logical 1) is propagated by those cells of the column 14a containing an FET 22, that is, cells 12a. Those cells of the column 14a lacking an FET 22, that is, cells 12b, do not propagate the signal representing a logical 1. Hence, signals each representing a logical 1 are propagated on bit lines BL0, BL2 and BL3 because the associated cells 12a of column 14a each contain an FET 22. Conversely, a signal representing a logical 0 remains on bit line BL1 because the associated cell 12b of column 14a does not contain an FET 22 as shown in FIG. 2.

FIG. 3 shows one example of the layout of a portion of a column of bit cells in which two adjacent bit cells 12a each contain an FET 22. Each FET 22 has a source region 30 electrically coupled by a connection region 32 and connection metalizations 34 to a conductive supply line 36 which may be a polysilicon line, for example. The supply voltage may be designated Vss. Each FET 22 further has a drain region 40 electrically coupled by a bit line connection region 42 to an associated bit line such as the bit line BL0, BL1 as shown in FIG. 3.

A conductive line 50 is connected to each gate of FET's 22 of the column of memory cells 12a, 12b. The conductive line 50 may be formed of polysilicon, for example, and provides a word line such as word line WL3 [FIG. 2], for example. A signal applied to conductive line 50 is propagated to the bit lines BL0, BL1 as a logical 1 signal on each bit line BL0, BL1.

FIG. 4 shows an example of a prior art memory circuit 60 which includes ROM array with 14-banks Bank0, Bank1 . . . Bank13 in this example. The circuit 60 is divided into two sections, a high section 60a and a low section 60b each of them containing 14 banks each [Bank0, Bank1 . . . Bank13]. Within each bank Bank0, for example, words/bits are arranged to form an array of ROM cells. Associated with each section 60a, 60b is input/output (I/O) circuitry 62a, 62b which includes keeper circuitry for maintaining voltage levels, precharge circuitry and clock distribution circuitry.

As previously mentioned a word line or a portion of a word line such as the word line 50 may be formed of polysilicon material. In order to reduce word line resistance, a "strapping" cell may be used to strap the polysilicon word line with a strapping line formed of an upper-layer low resistance conductive metal material. FIG. 5 shows a portion of a column 70 of ROM cells 12 having a common polysilicon word line 50. As shown in FIG. 5, interspersed with the ROM cells 12 is a strapping cell 72 to strap the polysilicon word line 50 with a strapping line 74 formed by an upper-layer conductive metal material. In this example, a strapping cell 72 is positioned in the column 70 every twelve cells of the ROM memory cell 12 type.

DETAILED DESCRIPTION

In the following description, reference is made to the accompanying drawings which form a part hereof and which illustrate several embodiments. It is understood that other embodiments may be utilized and structural and operational changes may be made without departing from the scope of the descriptions provided.

Figure 1:
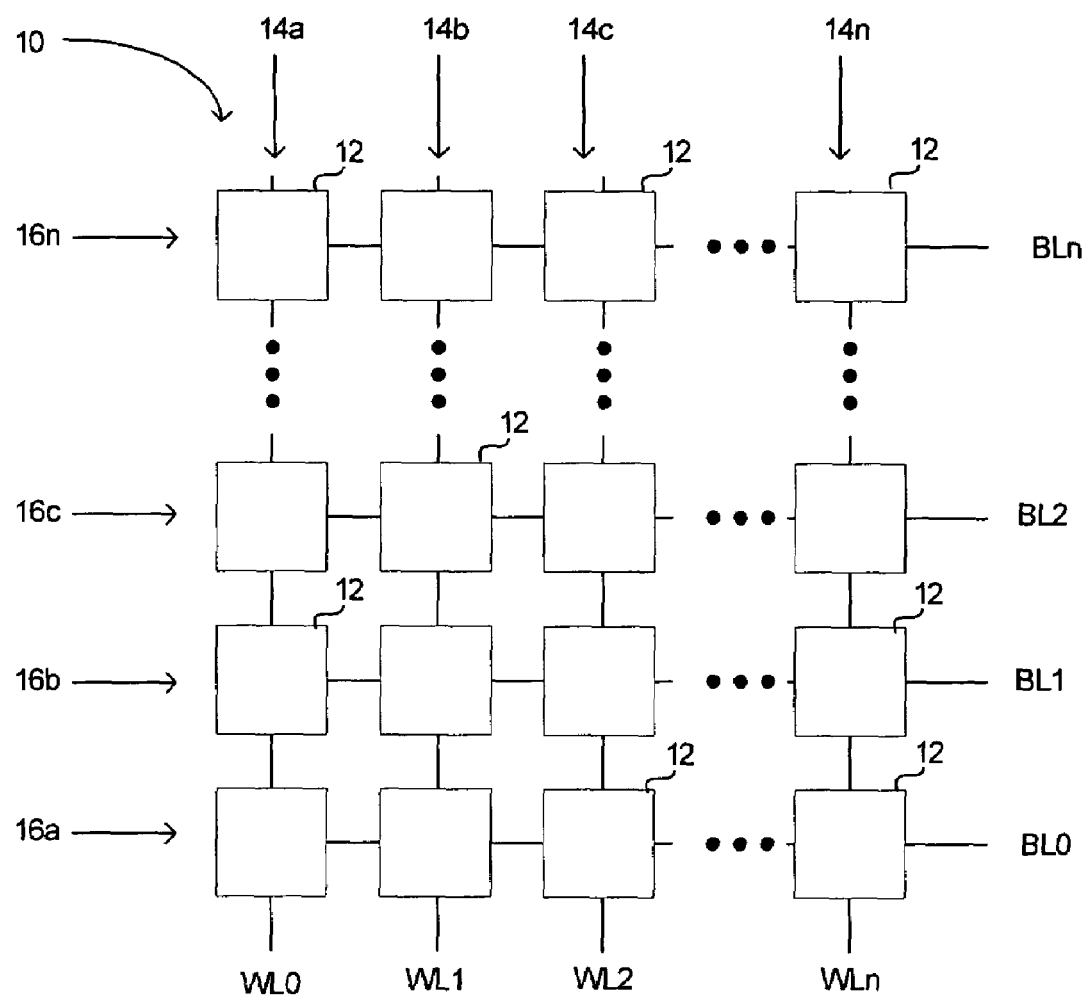
FIG. 1 illustrates a prior array of memory cells.
Figure 2:
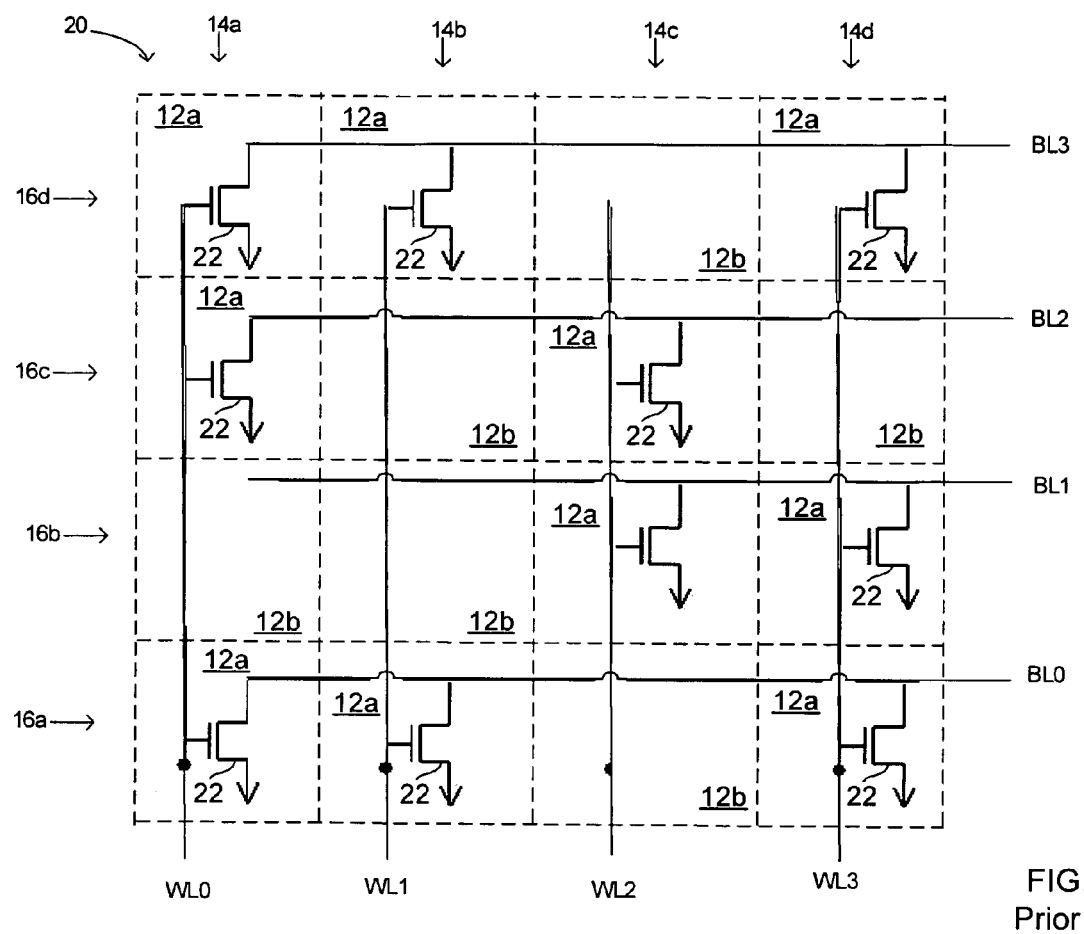
FIG. 2 illustrates a prior array of programmed ROM cells.
Figure 3:
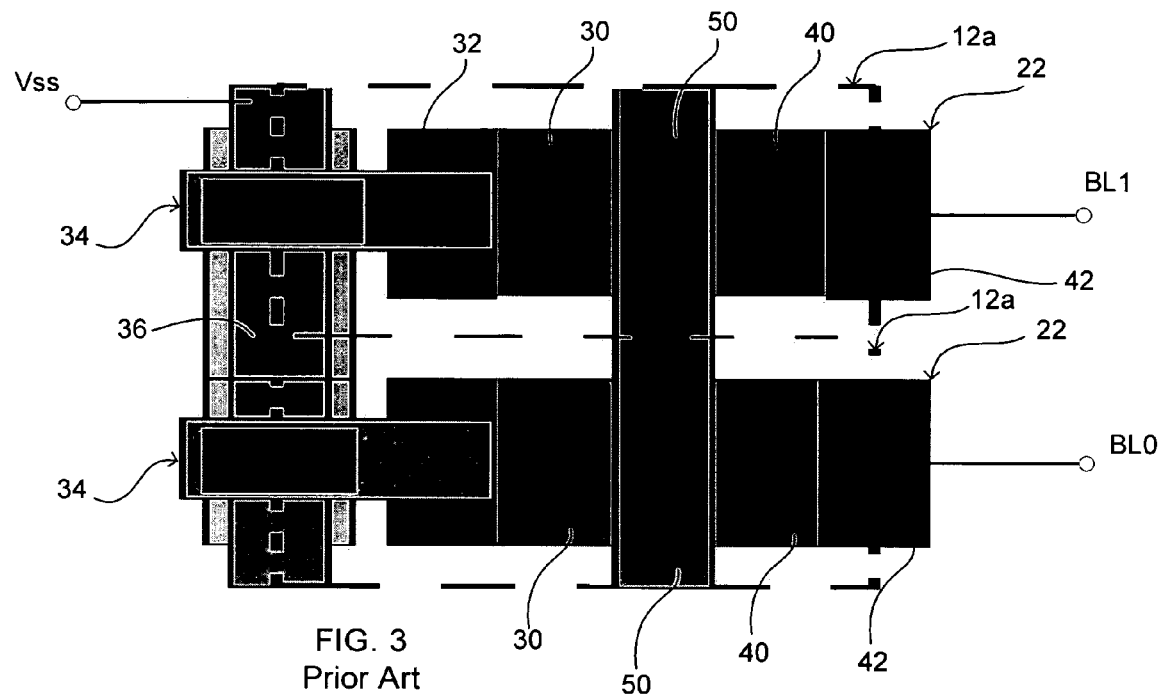
FIG. 3 illustrates a prior layout of an FET transistor in a column of ROM cells.
Figure 6:
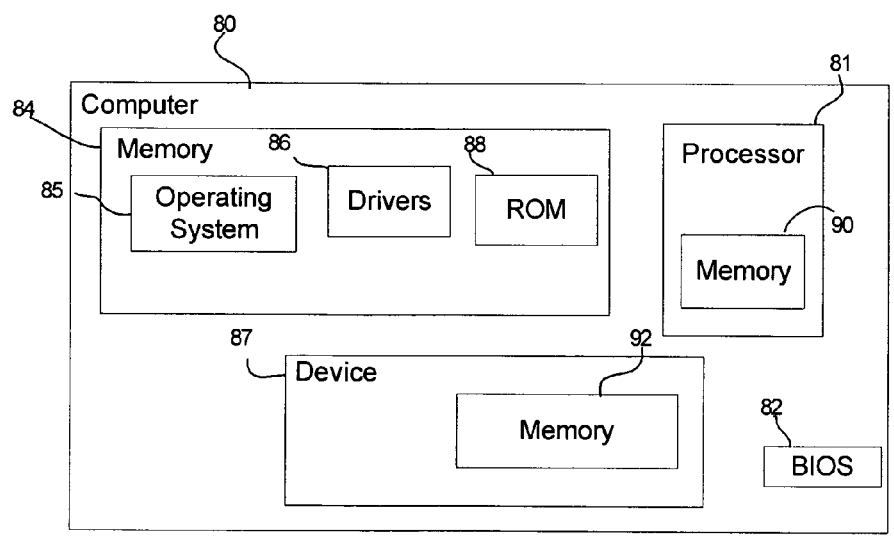
FIG. 6 illustrates an embodiment of a computing environment in which aspects of the present description may be utilized.

FIG. 6 illustrates one example of a computing environment used with the described embodiments. A computer 80 includes a processor 81 (such as one or more central processing units (CPU)), a basic input/output system (BIOS) 82 including code executed by the processor 81 to initialize and control various computer 80 components (e.g., the keyboard, display screen, disk drives, serial communications, etc.) during a boot sequence. The computer 80 includes a memory 84, comprising one or more volatile memory devices, such as volatile random access memory (RAM), in which an operating system 85 and one or more drivers 86, such as a device driver interfacing with an attached device 87, are loaded into the memory 84 implementing a runtime environment. In some applications, the memory 84 may further include nonvolatile ROM memory 88 (e.g., ROM, PROM, a flash memory, Electronically Erasable Programmable Memory (EEPROM), etc.) and storage nonvolatile memory (e.g., optical disk drives, magnetic disk drives etc.)

The processor 81 may have memory 90 for uses such as cache memory and storing instructions sets, for example. The memory 90 may include volatile and nonvolatile memory (e.g., RAM, ROM, PROM, a flash memory, Electronically Erasable Programmable Memory (EEPROM), etc.).

Similarly, the device 87 may have memory 92 which may include volatile and nonvolatile memory (e.g., RAM, ROM, PROM, a flash memory, Electronically Erasable Programmable Memory (EEPROM), etc.). There may be multiple device drivers providing interfaces to multiple attached devices. As part of the boot sequence, the device driver 86 may load device code in a non-volatile portion of memory 92 of the device 87 into the memory 84. The device 87 may comprise any type of Input/Output (I/O) device internal or external to a housing of the computer 80, such as the case for an internal hard disk drive or video chipset, which may be integrated on the computer 80 motherboard or on an expansion card inserted in an expansion slot on the computer 80 motherboard). The BIOS 82 may be implemented in firmware in a non-volatile memory device on the computer 80 motherboard, such as a Flash memory, Read Only Memory (ROM), Programmable ROM (PROM), etc. The BIOS 82 code indicates the sequence of the boot operations. The operating system 85 may comprise a suitable operating system, such as a Microsoft® Windows® operating system, Linux™, Apple® Macintosh®, etc. (Microsoft and Windows are registered trademarks of Microsoft Corporation, Apple and Macintosh are registered trademarks of Apple Computer, Inc., and Linux is a trademark of Linus Torvalds). The computer 80 may comprise any suitable computing device, such as a mainframe, server, personal computer, workstation, laptop, handheld computer, telephony device, network appliance, virtualization device, storage controller, network controller, etc. The processor 81 may be any suitable processor such as a microprocessor integrated circuit. The memory 90 may be onboard the same chip as the controller logic of the microprocessor.

Figure 7:
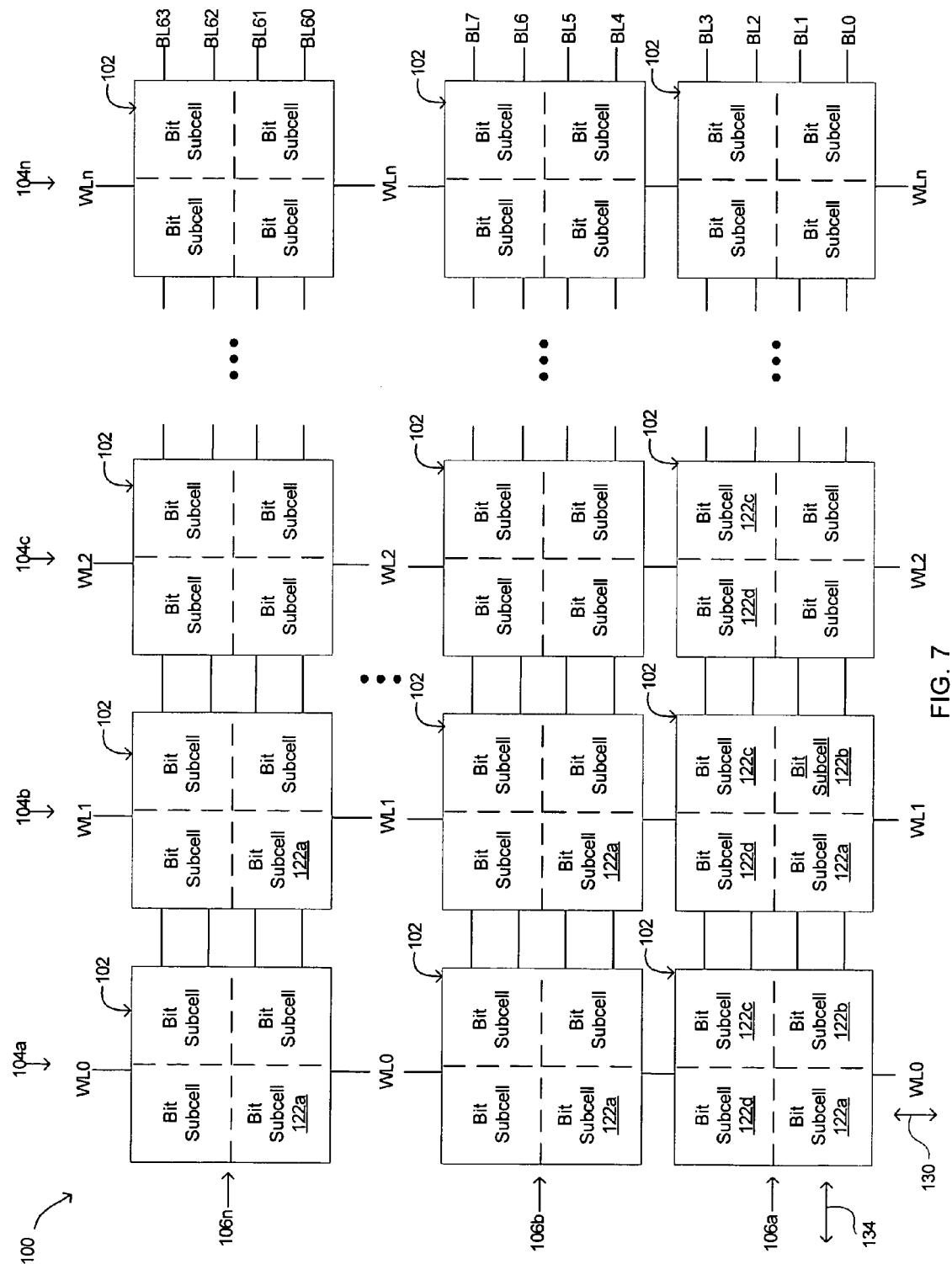
FIG. 7 illustrates one example of an array of memory cells in accordance with the present description.

FIG. 7 shows one example of an array 100 of multibit memory cells 102 in which each cell 102 is capable of storing more than one bit. As described in greater detail below, in accordance with one aspect of the present description, such an arrangement permits separate strapping cells to be reduced in number or eliminated. As a consequence, the overall size of the array 100 may be reduced. It is appreciated that in other applications, aspects of the description provided herein may be utilized in applications in which the number of strapping cells is increased and the size of the array is increased. The particular aspects utilized may vary, depending upon the particular application. Also, in the illustrated embodiment, the memory cells 102 are ROM memory cells. It is appreciated that the present description may be applicable to other types of memory including RAM memory.

In the illustrated embodiment, each multibit memory cell 102 is capable of storing 4 bits. Accordingly, each cell 102 may also be referred to as a "quadbit" memory cell in this application. It is appreciated that in other applications, the number of bits which a multibit cell may store may vary, depending upon the particular application. For example, the number of bits stored in each cell may be a power of 2 including 2, 4, 8, 16 etc. It is further appreciated that the number of bits stored in each cell may be other than a power of 2, depending upon the particular application.

In this example, the array 100 of quadbit cells 102 is arranged in a plurality of columns 104a, 104b . . . 104n and rows 106a, 106b . . . 106n. Each quadbit memory cell 102 stores four bits of data and has four bit lines. In this example, a word has 64 bits which are read out on bit lines BL0, BL1 . . . BL63. However, the number of bits in a word may vary but is frequently a power of 2. The bit lines BL0, BL1, BL2 and BL3 are electrically coupled to each of the quadbit cells 102 in a row 106a of the array 100. Similarly, the bit lines BL4, BL5, BL6 and BL7 are electrically coupled to each of the quadbit cells 102 in row 106b and so on. The bits stored in a particular column 104a, 104b . . . 104n of quadbit cells 102 may be read by activating a particular word line BL0, BL1 . . . BL63 which is electrically coupled to each quadbit cell 102 of an associated column 104a, 104b . . . 104n of quadbit cells 102.

Each quadbit memory cell 102 includes a plurality of bit subcells. In the illustrated embodiment, each cell 102 has four subcells 122a, 122b, 122c and 122d. It is appreciated however, that the number of bit subcells in each cell 102 may vary, as discussed above. Each bit subcell 122a, 122b, 122c and 122d may be selected to contain a device such as a diode, a programmable fuse, or a field effect transistor (FET) by which a logical value may be stored in each bit subcell 122a, 122b, 122c and 122d.

In the illustrated embodiment, the bit subcells 122a, 122b, 122c and 122d of each cell 102 are arranged in a 2 by 2 array in which subcells 122a and 122d are aligned in a longitudinal direction as represented by an arrow 130. Similarly, the subcells 122b and 122c are aligned in a longitudinal direction parallel to the arrow 130. Conversely, the subcells 122a and 122b are aligned in a transverse direction as represented by an arrow 134. Similarly, the subcells 122c and 122d are aligned in a transverse direction parallel to the arrow 134. In this embodiment, the longitudinal and transverse directions represented by the arrows 130 and 134, respectively are orthogonal. It is appreciated that bit subcells may be arranged in an array having nonorthogonal longitudinal and transverse directions. Also, in this embodiment, the bit subcells 122a, 122b, 122c and 122d are schematically represented as being square or rectangular in shape. It is appreciated that the subcells may have other shapes including diamond, triangular, pentagonal, hexagonal etc. It is further appreciated that the shapes may be irregular or asymmetrical.

Figure 8:
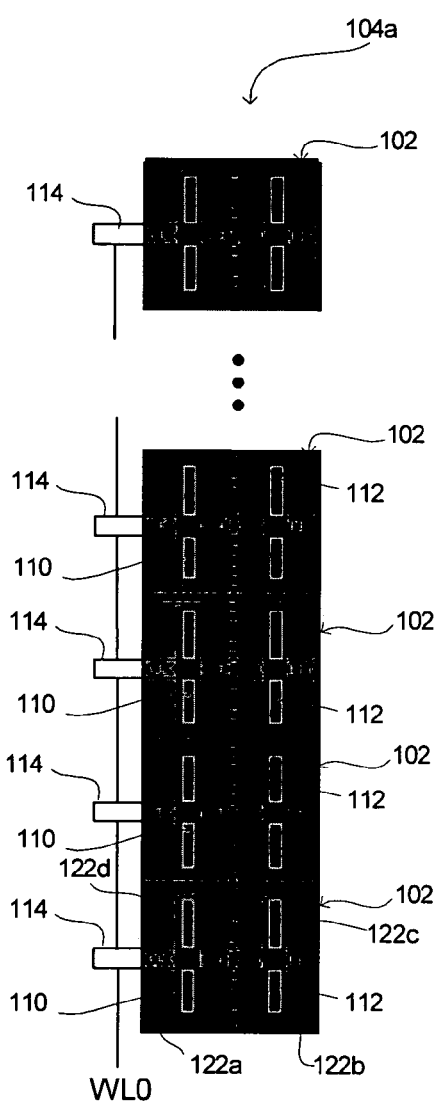
FIG. 8 illustrates one example of a portion of a column of memory cells in accordance with the present description.

In one aspect of the present description, in some applications, the multibit cell permits the number of strapping cells for a word line to be reduced or eliminated entirely. FIG. 8 shows one example of a column of multibit cells such as the column 104a of quadbit cells 102. As depicted in FIG. 7, the column 104a of quadbit cells 102 has a common word line WL0. In this example of FIG. 8, the column 104a has 16 quadbit cells 102 arranged in a column to store 64 bits in 64 bit subcells without a separate strapping cell in the column 104a for the word line WL0.

In this embodiment, the word line WL0 has for each memory cell 102, a pair of conductor lines 110, 112 which may be formed of a conductive semiconductor material such as polysilicon, for example. It is appreciated that the word line conductor lines 110, 112 may be formed of a variety of conductive materials including conductive metals.

As shown in FIG. 8, each word line conductor line 110 of a particular memory cell 102 extends across a pair of bit subcells 122a, 122d. Similarly, each word line conductor line 112 of a particular memory cell 102 extends across a pair of bit subcells 122b, 122c. If a particular bit subcell is programmed to have a logical value by placing a device with an input in the subcell, the word line conductor lines 110, 112 of the word line WL0 are electrically coupled to such inputs. For example, the device may be an FET having a gate as a control input electrically coupled to the word line WL0.

Each cell 102 has a word line strapping line 114 extending across the cell 102 in a direction transverse to the direction of the conductor lines 110, 112 and electrically coupled to each word line conductor line 110, 112. Each of the word line strapping lines 114 of the column 104a are electrically coupled to each other as a part of a word line, such as the word line WL0 as shown in FIG. 8. In the illustrated, the word line strapping lines 114 are orthogonal to the associated word line conductor lines 110, 112. It is appreciated that the relationship between the word line strapping lines and the word line conductor lines may vary, depending upon the particular application.

In the embodiment of FIG. 8, the word line strapping lines 114 are spaced at a pitch of two bit subcells. It is appreciated that the spacing may vary, depending upon the size and arrangement of the array of bit subcells within each cell 102 of a column 104a, 104b . . . 104n. Also, in this embodiment, the word line strapping lines 114 bisect each memory cell 102 and each word line conductor line 110, 112 bisects its associated bit subcell pair. It is appreciated that the placement of the word line strapping lines and conductor lines within a memory cell or subcell, may vary, depending upon the particular application.

In yet another aspect, the polysilicon charging ratio may be improved. The charging ratio is a function of the maximum permitted polysilicon line length extending over empty bit cells (or bit subcells) divided by the diffusion length of the programming device such as an FET, for example. As shown in FIG. 8, each word line conductor line 110, 112 extends across two adjacent bit cells 122a, 122d or 122b, 122c, one of which may be empty and thus may be charged. In contrast, the conductor line 50 of the example of FIG. 5 may extend over eleven adjacent empty cells 12 to charge a twelfth cell 12, and therefore may have a substantially greater polysilicon charging ratio.

Figure 4:
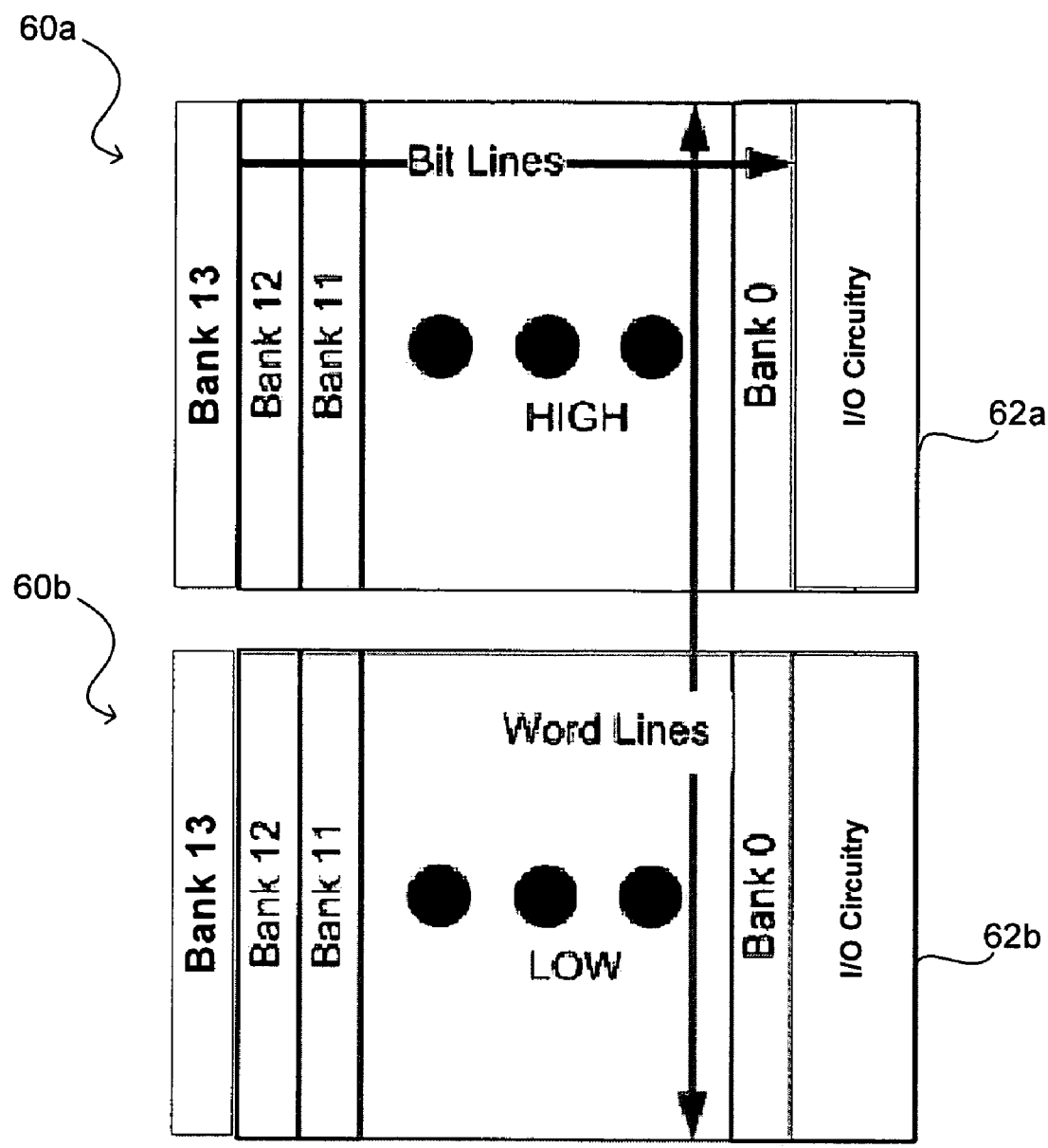
FIG. 4 illustrates a prior memory circuit.
Figure 5:
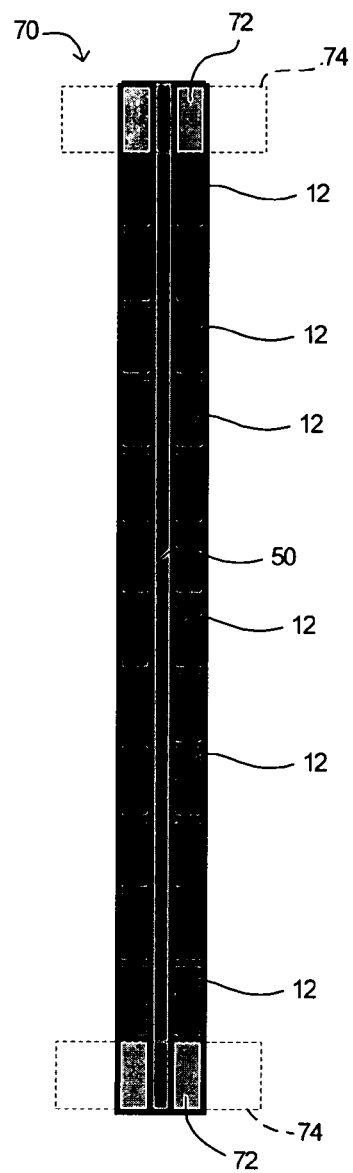
FIG. 5 illustrates a portion of a prior column of memory cells.

In another aspect, the size of a layout may be reduced. As shown in FIG. 8, the height of a column of three quadbit cells 102 capable of storing 12 bits may be substantially shorter than a corresponding single file column of twelve memory cells 12 as shown in FIG. 5. Still further, a column of multibit cells in accordance with the present description may be compatible with associated I/O circuitry which is similarly reduced in height as compared to the I/O circuitry 62a, 62b of FIG. 4. However, I/O circuitry which is reduced in height as compared to the I/O circuitry 62a, 62b may not be compatible with the memory cell arrays 60a, 60b of FIG. 4 since in many applications, the pitch of the memory cell array and its associated I/O circuitry frequently is relatively close in size.

Figure 9:
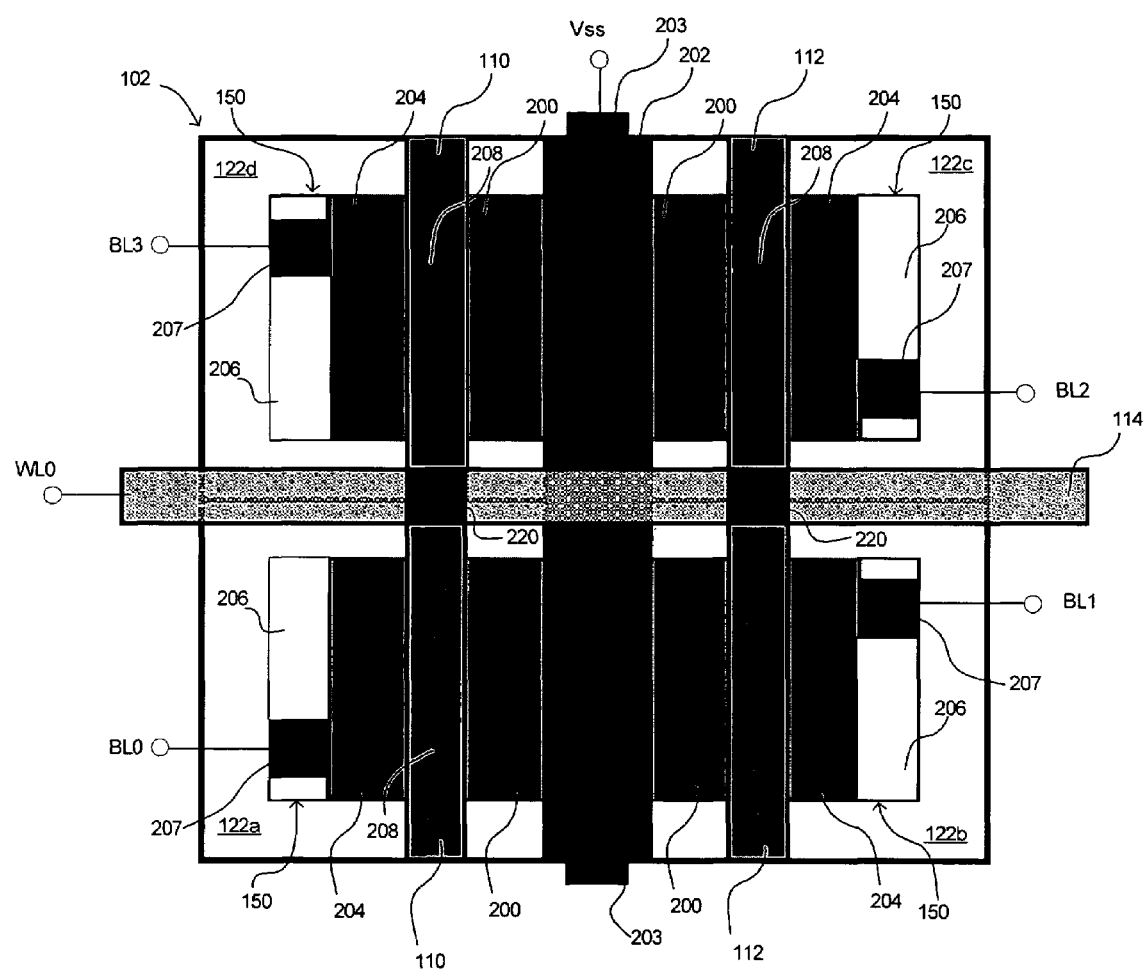
FIG. 9 illustrates one example of a layout of one or more FET transistors in a multibit cell in accordance with the present description.

FIG. 9 shows an example of a quadbit memory cell 102 which has been programmed with a logical value, such as a logical 1, for example, in each bit subcell 122a, 122b, 122c, 122d of the cell 102, by placing an n-type pull-up FET transistor 150 in each subcell 122a, 122b, 122c, 122d being programmed with the particular logical value. It is appreciated that other devices may be used for programming the bit subcells including p-channel FET's, diodes, fuses, etc. In the illustrated embodiment, the FET's 150 of the bit subcells 122a, 122b are positioned back to back with adjacent sources 200 electrically coupled to a centrally located power supply line 202 which may be made of polysilicon, for example. Similarly, the FET's 150 of the bit subcells 122c, 122d are positioned back to back with adjacent sources 200 electrically coupled to the centrally located power supply line 202. The power supply line 202 bisects the memory cell 102 and is electrically coupled to a power supply designated Vss in this example by a via 203 or other suitable metallization. It is appreciated that the layout of the FET's 150, and power supply lines 202 may vary within the cells 102 and bit subcells, depending upon the particular application.

Each FET 150 further has a drain 204 which is electrically coupled by a bit line conductor 206 and a via 207 to an associated bit line. Thus, for example, the drain 204 of the FET 150 of the bit subcell 122a is electrically coupled to the bit line BL0. Each FET 150 has a gate 208 which is electrically coupled to a word line conductor line 110, 112 which bisects the associated subcell pair. Thus, in this embodiment, each FET has an input, that is, the source 200, an output, that is, the drain 204 and a control input, that is, the gate 208. The word line conductor lines 110, 112 are electrically coupled to the word line strapping line 114 by vias 220 or other suitable metallization.

ADDITIONAL EMBODIMENT DETAILS

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention. Further, although process operations, method operations, algorithms or the like may be described in a sequential order, such processes, methods and algorithms may be configured to work in alternate orders. In other words, any sequence or order of operations that may be described does not necessarily indicate a requirement that the operations be performed in that order. The operations of processes described herein may be performed in any order practical. Further, some operations may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article. The functionality and/or the features of a device may be alternatively embodied by one or more other devices which are not explicitly described as having such functionality/features. Thus, other embodiments of the present invention need not include the device itself.

In certain implementations, the embodiments may be included in a computer system including nonvolatile memory and a storage controller, such as a SCSI, Integrated Drive Electronics (IDE), Redundant Array of Independent Disk (RAID), etc., controller, that manages access to a non-volatile storage device, such as a magnetic disk drive, tape media, optical disk, etc. In alternative implementations, embodiments may be included in a system that does not include nonvolatile memory or a storage controller, such as certain hubs and switches.

In certain implementations, the embodiments may be implemented in a computer system including a video controller to render information to display on a monitor electrically coupled to the computer system including the host software driver and network controller, such as a computer system comprising a desktop, workstation, server, mainframe, laptop, handheld computer, etc. Alternatively, the network controller and host software driver embodiments may be implemented in a computing device that does not include a video controller, such as a switch, router, etc.

The devices 87 of the architecture of the system 80 may include a network controller to enable communication with a network, such as an Ethernet, a Fibre Channel Arbitrated Loop, etc. Further, the architecture may, in certain embodiments, include a video controller to render information on a display monitor, where the video controller may be implemented on a video card or integrated on integrated circuit components mounted on the motherboard.

An input device may be used to provide user input to the processor 81, and may include a keyboard, mouse, pen-stylus, microphone, touch sensitive display screen, or any other suitable activation or input mechanism. An output device may be capable of rendering information transmitted from the processor 81, or other component, such as a display monitor, printer, storage, etc.

The embodiments of the present description may be implemented on an expansion card such as a network card, such as a Peripheral Component Interconnect (PCI) card or some other card, or on integrated circuit components mounted on the motherboard.

The foregoing description of various embodiments has been presented for the purposes of illustration. It is not intended to be exhaustive or to limit to the precise form disclosed. Many modifications and variations are possible in light of the above teaching.

What is claimed is:

1. A memory, comprising:

a cell having a plurality of bit subcells, each bit subcell being adapted to store a bit of a common word, wherein said bit subcells are arranged in an array within said cell, said array having a plurality of bit subcells in a longitudinal direction and a plurality of bit subcells in a transverse direction;

wherein said longitudinal and transverse directions are orthogonal, said cell has four bit subcells, wherein said array is a 2 by 2 array of bit subcells within said cell, said cell has a word line electrically coupled to each subcell, each subcell has a bit line output and at least one subcell has a transistor having a control input electrically coupled to a word line and an output electrically coupled an associated bit line output of said at least one bit subcell, and said word line comprises a conductive metal strapping line positioned across said cell, and a pair of semiconductor lines, each semiconductor line being positioned across a pair of bit subcells of said 2 by 2 array of bit subcells and electrically coupled to a control input of a transistor if present within a bit subcell of said pair of bit subcells, each semiconductor line further being electrically coupled to said strapping line.

2. The memory of claim 1 wherein said strapping line is orthogonal to each of said semiconductor lines.

3. The memory of claim 2 wherein said cell has a power supply line positioned across said cell and wherein the transistor of each subcell having a transistor is a field effect transistor having a gate which provides said control input, each field effect transistor having an input coupled to said power supply line.

4. The memory of claim 3 wherein said power supply line is orthogonal to said strapping line.

5. The memory of claim 1 wherein said memory is a read only memory.

6. A processor, comprising:

controller logic; and a memory coupled to said logic and including a plurality of cells, each cell having a plurality of bit subcells, each bit subcell being adapted to store a bit of a common word, wherein said bit subcells are arranged in an array within said cell, said array having a plurality of bit subcells in a longitudinal direction and a plurality of bit subcells in a transverse direction;

wherein said longitudinal and transverse directions are orthogonal and wherein said cell has four bit subcells, wherein said array is a 2 by 2 array of bit subcells within said cell, said cell has a word line electrically coupled to each subcell, each subcell has a bit line output and at least one subcell has a transistor having a control input electrically coupled to a word line and an output electrically coupled an associated bit line output of said at least one bit subcell, and said word line comprises a conductive metal strapping line positioned across said cell, and a pair of semiconductor lines, each semiconductor line being positioned across a pair of bit subcells of said 2 by 2 array of bit subcells and electrically coupled to a control input of a transistor if present within a bit subcell of said pair of bit subcells, each semiconductor line further being electrically coupled to said strapping line.

7. The processor of claim 6 wherein said strapping line is orthogonal to each of said semiconductor lines.

8. The processor of claim 7 wherein said cell has a power supply line positioned across said cell and wherein the transistor of each subcell having a transistor is a field effect transistor having a gate which provides said control input, each field effect transistor having an input coupled to said power supply line.

9. The processor of claim 6 wherein said memory is a read only memory.

10. The processor of claim 6 wherein said processor is a microprocessor integrated circuit.

11. A system, comprising
a processor;
a read only memory coupled to said processor and including a plurality of cells, each cell having a plurality of bit subcells, each bit subcell being adapted to store a bit of a common word, wherein said bit subcells are arranged in an array within said cell, said array having a plurality of bit subcells in a longitudinal direction and a plurality of bit subcells in a transverse direction; and
a video controller;
wherein said longitudinal and transverse directions are orthogonal and wherein said cell has four bit subcells, wherein said array is a 2 by 2 array of bit subcells within said cell, said cell has a word line electrically coupled to each subcell, each subcell has a bit line output and at least one subcell has a transistor having a control input electrically coupled to a word line and an output electrically coupled an associated bit line output of said at least one bit subcell, and said word line comprises a conductive metal strapping line positioned across said cell, and a pair of semiconductor lines, each semiconductor line being positioned across a pair of bit subcells of said 2 by 2 array of bit subcells and electrically coupled to a control input of a transistor if present within a bit subcell of said pair of bit subcells, each semiconductor line further being electrically coupled to said strapping line.

12. The system of claim 11 wherein said strapping line is orthogonal to each of said semiconductor lines.

13. The system of claim 12 wherein said cell has a power supply line positioned across said cell and wherein the transistor of each subcell having a transistor is a field effect transistor having a gate which provides said control input, each field effect transistor having an input coupled to said power supply line.

14. The system of claim 13 wherein said power supply line is orthogonal to said strapping line.

15. The system of claim 11 wherein said memory is a read only memory.

16. The system of claim 11 wherein said processor is a microprocessor integrated circuit.

17. A method, comprising:
selecting a common word line electrically coupled to each of four bit subcells of a cell of a read only memory, wherein said bit subcells are arranged in a 2 by 2 array within said cell; and
reading four bit lines of said cell, each bit line being electrically coupled to an output of an associated bit subcell of said cell;
wherein logical bits have been selectively programmed into said four bit subcells of a cell of a read only memory, in which a transistor has been one of placed and omitted in a bit subcell in accordance with the value of the programmed logical bit.

18. The method of claim 17 wherein said transistor is a field effect transistor.

19. A method, comprising:
selectively programming logical bits into four bit subcells of a cell of a read only memory, wherein said bit subcells are arranged in a 2 by 2 array within said cell and have a common word line and wherein said logical bit selective programming includes one of placing and omitting placing a transistor in a bit subcell in accordance with the value of the logical bit being programmed.

20. The method of claim 19 wherein said memory is a read only memory having field effect transistors.

* * * * *